United States Patent
Iltchenko et al.

(10) Patent No.: US 6,389,197 B1
(45) Date of Patent: May 14, 2002

(54) COUPLING SYSTEM TO A MICROSPHERE CAVITY

(75) Inventors: Vladimir Iltchenko, La Canada; Lute Maleki, Pasadena; Steve Yao, Diamond Bar; Chi Wu, San Marino, all of CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/501,824

(22) Filed: Feb. 10, 2000

Related U.S. Application Data

(60) Provisional application No. 60/119,435, filed on Feb. 10, 1999, and provisional application No. 60/123,696, filed on Mar. 8, 1999.

(51) Int. Cl.$^7$ ................................................ G02B 6/26
(52) U.S. Cl. .......................... 385/28; 385/30; 385/37; 372/9
(58) Field of Search .......................... 385/14, 9, 27–39, 385/42–50

(56) References Cited

U.S. PATENT DOCUMENTS

| | | | |
|---|---|---|---|
| 3,915,652 A | 10/1975 | Natelson | 23/259 |
| 5,560,811 A | 10/1996 | Briggs et al. | 204/451 |
| 5,785,926 A | 7/1998 | Seubert et al. | 422/100 |
| 5,840,573 A | 11/1998 | Fields | 435/287.2 |
| 5,926,496 A * | 7/1999 | Ho et al. | 372/92 |
| 6,122,299 A * | 9/2000 | DeMars et al. | 385/14 X |

FOREIGN PATENT DOCUMENTS

| | | |
|---|---|---|
| WO | WO 98/04920 | 2/1998 |
| WO | WO 00/44074 | 7/2000 |

OTHER PUBLICATIONS

Ilchenko et al., "Pigtailing the high–Q microsphere cavity: a simple fiber coupler for optical whispering–gallery modes," Optics Letters, vol. 24, No. 11, pp. 723–725, Jun. 1, 1999.
Ilchenko et al., "Microsphere integration in active and passive photonics devices," Proceedings of SPIE, vol. 3930, pp. 154–162, 2000.
Gorodetsky et al., "Optical microsphere resonators: optimal coupling to high–Q whispering–gallery modes," J. Opt. Soc. Am. B, vol. 16, No. 1, pp. 147–154, Jan. 1999.

* cited by examiner

*Primary Examiner*—Phan T. H. Palmer
(74) *Attorney, Agent, or Firm*—Fish & Richardson P.C.

(57) ABSTRACT

A system of coupling optical energy in a waveguide mode, into a resonator that operates in a whispering gallery mode. A first part of the operation uses a fiber in its waveguide mode to couple information into a resonator e.g. a microsphere. The fiber is cleaved at an angle Φ which causes total internal reflection within the fiber. The energy in the fiber then forms an evanescent field and a microsphere is placed in the area of the evanescent field. If the microsphere resonance is resonant with energy in the fiber, then the information in the fiber is effectively transferred to the microsphere.

26 Claims, 7 Drawing Sheets

COUPLING SYSTEM TO A MICROSPHERE CAVITY

CROSS-REFERENCE TO RELATED APPLICATIONS

This application claims benefit of U.S. Provisional application No. 60/119,435, filed Feb. 10, 1999 and application Ser. No. 60/123,696 filed Mar. 8, 1999.

STATEMENT AS TO FEDERALLY-SPONSORED RESEARCH

The invention described herein was made in the performance of work under a NASA contract, and is subject to the provisions of Public Law 96-517 (U.S.C. 202) in which the Contractor has elected to retain title.

BACKGROUND

Microsphere resonators have certain desirable characteristics including exceptionally high quality ("Q") factors, and small dimensions. Optical systems often use microsphere resonators as a building block for fiber optic systems. However, it is often necessary to couple optical energy from an optical fiber into the microsphere cavity. The existing couplers often suffer from certain drawbacks.

SUMMARY

This application teaches new ways of launching energy into a resonator device such as a microsphere resonator.

A first way of doing this is by operating using a direct fiber coupling to a resonator, e.g. a microsphere using a hybrid of a waveguide and prism coupler formed on the fiber itself. Another aspect of the disclosure describes using a surface grating on the resonator in a way that disrupts the evanescent field to allow input and output coupling.

BRIEF DESCRIPTION OF THE DRAWINGS

These and other aspects will now be described in detail with respect to the accompanying drawings, wherein.

DETAILED DESCRIPTION

Figure 1:
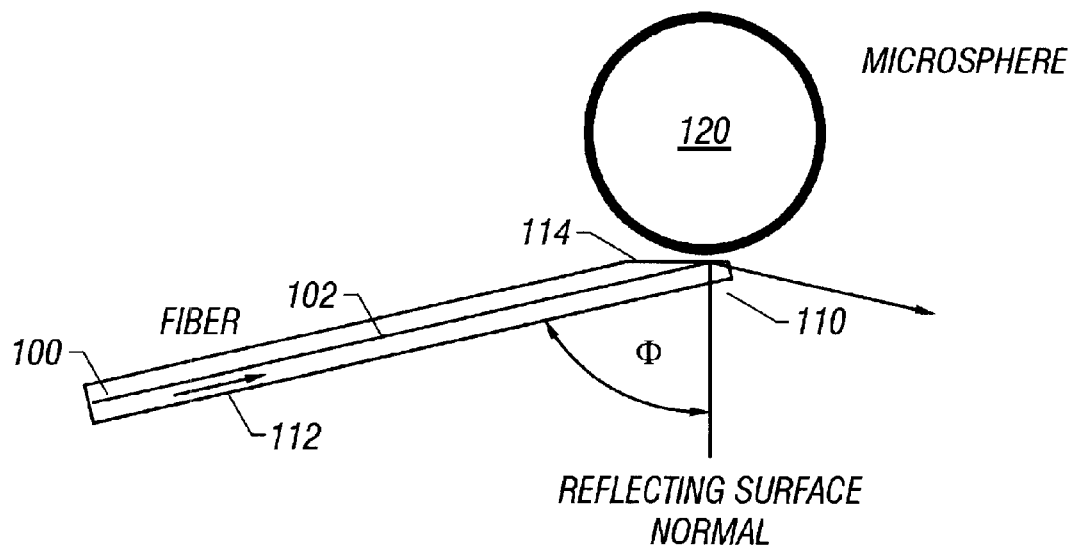
FIG. 1 shows an angle polished fiber coupler system for coupling a microsphere.

FIG. 1 shows the basic schematic embodiment of a first fiber coupler system. A single mode fiber 100 has an end 110 which will be used to couple propagating light 112 into a resonator 120 which can be a microsphere resonator. The single mode fiber 100 is formed with its end area 110 having an angled portion 114. The angled portion 114 forms an angle $\omega=180-\Phi$ with the direction of the axis of the fiber, as shown. The angle $\omega$ is controlled as described herein.

The light is coupled in the direction 112 and incident on the angled surface. Upon incidence, the light propagating inside the core comes into contact with the angled region 114. The light undergoes total internal reflection and then forms an evanescent field around the fiber end 110. Effectively the light escapes the fiber in this way. The microsphere 120 is placed in the area of the evanescent field. The energy from the evanescent field is efficiently exchanged in a resonant mode of the microsphere. Effectively, therefore, the information is resonantly transitioned between the "waveguide" mode of the single mode fiber and the whispering gallery mode in the microsphere.

The angle $\Phi$ is selected to satisfy a phase matching requirement. The angle is selected according to the relationship $\Phi=\arc\sin(n_{sphere}/n_{fiber})$. $N_{fiber}$ represents the effective refractive index that describes the guided wave in the fiber core truncation area 110. $N_{sphere}$ represents the effective refraction index that describes the azimuthal propagation of waveguide modes. These can be considered as closed waves, undergoing total internal reflection in the microsphere.

The linear dimensions of the angle-cut core area can match to the area of evanescent field overlap. This allows the system to operate similarly to a prism coupler with illuminated collimation focusing objects.

The effective refraction index can be used to define the azimuthal propagation of the waveguide modes near the surface of the sphere. These can be calculated based on asymptotic expressions for waveguide mode frequencies $\omega_{lq}$, where $n_{sphere}=cl/a\omega_{lq}$. L and q are respectively azimuthal and radial mode indexes, A is the radius of the sphere and c is the speed of light. Different indices can be calculated and used to form a model.

More specifically, the effective index to describe the azimuthal propagation of the WG modes can be calculated as $n_{sphere}=cl/a\omega_{lq})$ on the basis of asymptotic expressions for WG mode "positions" as follows:

$$\omega_{lq} = \frac{nc}{a}\left[v + 2^{-1/3}\alpha_q v^{1/3} - \frac{P}{(n^2-1)^{1/2}} + \left(\frac{3}{10}2^{-2/3}\right)\alpha_q^2 v^{-1/3} - \frac{2^{-1/3}P(n^2-2P^2/3)}{(n^2-1)^{3/2}}\alpha_q v^{-2/3} + O(v^{-1})\right]$$

Here l, q are azimuthal and radial mode indices respectively; a is the sphere radius; c is the speed of light; n is the refraction index of the sphere material (n=1.4440 (1.4469) for silica at the wavelength $\lambda$=1550 nm (1300 nm)); P=n for $TE_{lmq}$ modes and P=1/n for $TM_{lmq}$ modes; v=l+½; and $\alpha_q$—is the q-th root of the Airy function, Ai(-z), equal to 2.338, 4.088, 5.521 for q=1,2,3 respectively. Results of calculation of $n_{sphere}$ (at both wavelengths 1550 nm and 1300 nm) for silica spheres of different radii are given in FIG. 2. The calculation is made for three lowest radial order modes TE $(TM)_{lmq}$, q=1,2,3.

Since the guided wave in the core no longer exists after reflection, precise calculation of $n_{fiber}$ is a non-trivial task implying the explicit computation of the evanescent field in the trunctation area. However, as confirmed by the experiments below, a consistent recipe for a functional coupler can be based on a straightforward approximation that assumes $n_{fiber}$ equal to the effective mode index in a regular fiber.

In a specific embodiment, the standard Corning SMF-28 fiber is used with the germanium-doped core of diameter $2a=8.3$ μm and index difference of 0.36%. The material index of the core was $n_1=1.4505$; the material index of the cladding $n_2=1.4453$ at the wavelength $\lambda=1550$ nm, and correspondingly $n_1=1.4535$ and $n_2=1.4483$ at $\lambda=1300$ nm (Corning Inc Product Information sheet PI1036, 1998). As known from the theory of step-index fibers (see e.g. L.B.Jeunhomme, *Single-Mode Fiber Optics* (Marcel Dekker, N.-Y., 1983)), propagation constant for the core-guided mode can be approximated as follows:

$$\beta \approx kn_2\left[1 + \Delta\left(\frac{v}{V}\right)^2\right],$$

where $k=2\pi/\lambda$—is the free-space wavevector; $\Delta=(n_1-n_2)/n_2$—the relative index difference; v—the normalized transverse decay constant; $V=kn_2a(2\Delta)^{1/2}$—the normalized frequency. Using standard solution v(V) for the fundamental $LP_{01}$ mode of the fiber and the parameters of our fiber, the effective index relevant to the phase-matching condition is $n_{fiber}$ $\beta/k=1.4476$ at 1550 nm and $n_{fiber}=1.4509$ at 1300 nm.

Figure 2:
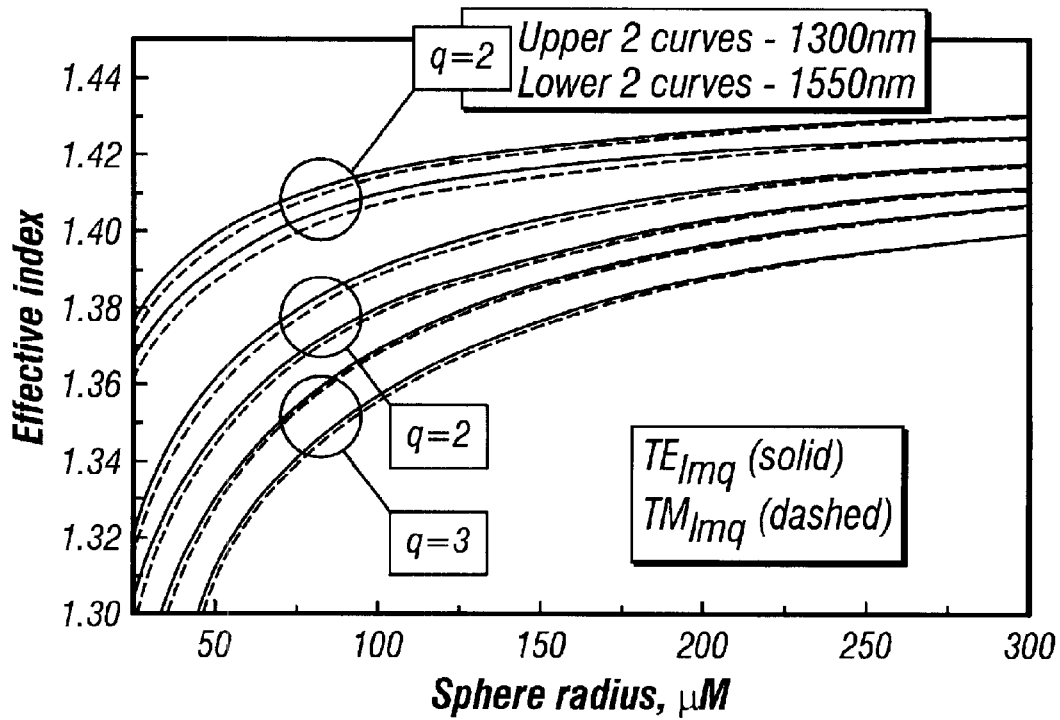
FIG. 2 shows a model of sphere radius verses fiber characteristic.

One exemplary model is shown in FIG. 2. In this model, different results of calculations are presented for different q values, at the frequency and for different resonators of different characteristics.

Another issue comes from the way in which the fiber and the modes operate after reflection from the truncation plane. After this reflection, the guided wave in the fiber no longer exists. Precise calculation of $n_{fiber}$ becomes difficult. It is assumed to be equal to the effective index $n_{guide}$ of the guided wave and the regular fiber, although the precise value may be difficult to obtain.

Figure 3A:
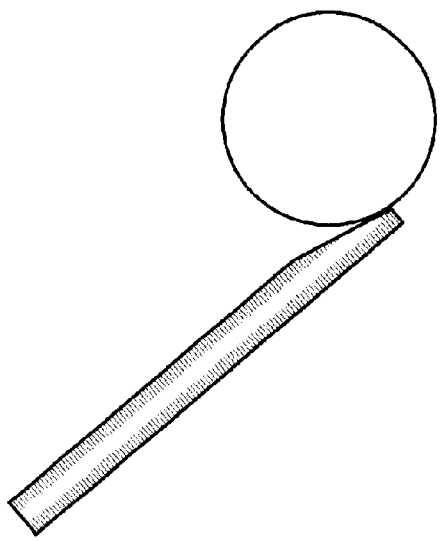
FIGS. 3A and 3B show single mode fibers and a resonator.
Figure 3B:
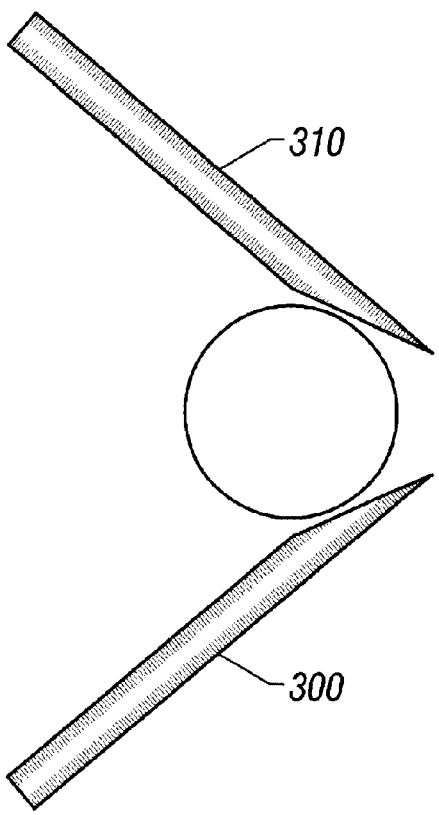

The specific way in which the system is used is shown in FIG. 3A and 3B. A close up view of the assembly has two fiber couplers 300, 310, each with cleaved ends as described herein. The polishing angles of the fibers are about 12.1 degrees and 13.3 degrees respectively or $\Phi=77.9°$ and $7.60°$. A fused silica rod 320 supports the microsphere 322 at a radius 235 μm between two angled conical fiber couplers. The optical information can be updated between the fibers, via the sphere.

The above has described one way of coupling optical energy into such a microsphere. Since evanescent waves are used for the energy coupling, this is effectively near-field coupling.

Figure 4A:
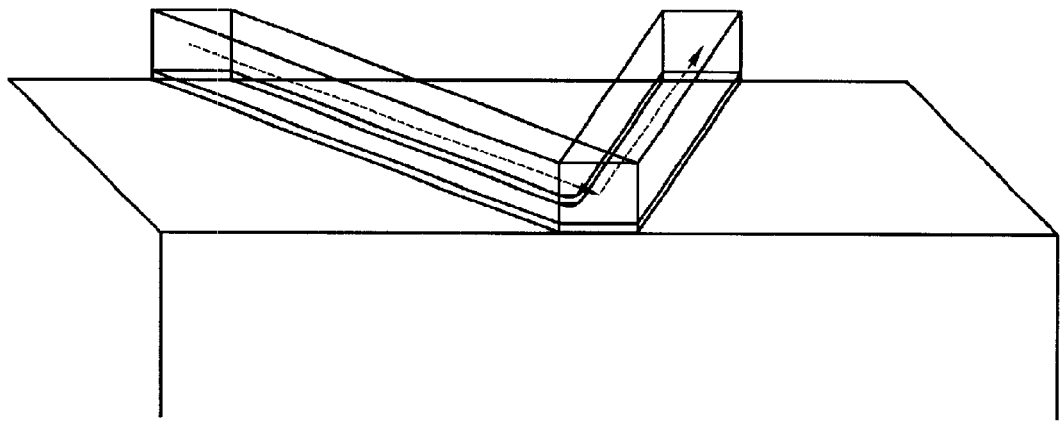
FIGS. 4A and 4B shown an embodiment using this waveguide to whispering mode technique for coupling between different waveguides.

The principle implemented in the above description of a single mode optical fiber coupler can also be extended to use integrated optic waveguides. FIG. 4A shows a total internal reflection mirror on a channel waveguide that provides a phase-matched excitation coupler for WG modes. The cutting angle $\Phi$ is defined, as previously, from the effective index of the guide and the effective index of azimuthal propagation of WG mode in particular sphere. Because of the high index available with planar semiconductor waveguides ($n_{guide}=3.0-3.5$), optimal coupling can be achieved with wide variety of cavity materials, by adjusting the angle $\Phi$ in accordance with the relation $\Phi=\arcsin(n_{sphere}/n_{guide})$.

Figure 4B:
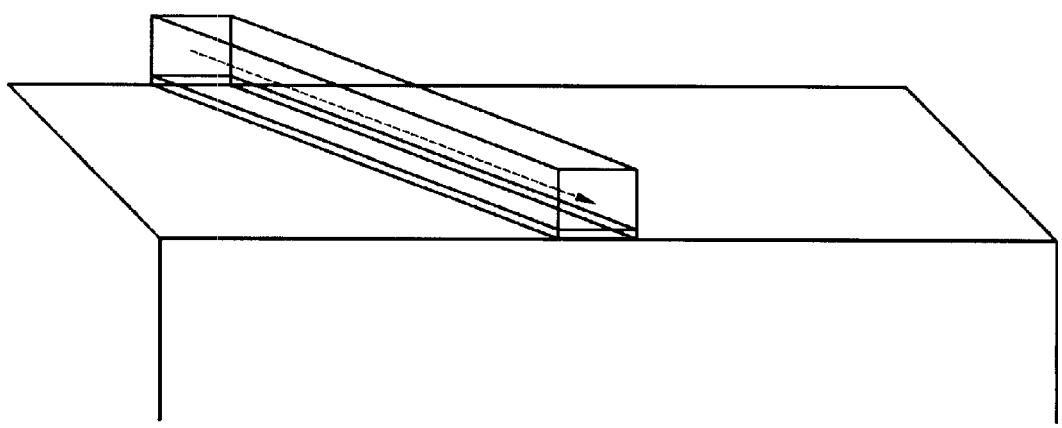

For example, if InP waveguides having an $n=3.17$ are on an InGaAsP supporting layer ($n=3.50$) over an InP substrate, the effective index for 3 μm×3 μm cross section will be $n_{guide}=3.30$. The optimal angle for excitation of $TE_{lm1}$ whispering gallery modes in 200 μm diameter fused silica sphere $\Phi=25°$, all near the wavelength 1550 nm. The configuration depicted in FIG. 6 can be fabricated by CVD (chemical vapor deposition) methods, lithography, wet etching, and subsequent cleaving of the wafer to provide a flat mirror surface at the reflection plane. More consistent results may be obtained with IAE (ion-assisted etching). If only input coupling is required, the waveguide may be simply truncated as shown in FIG. 4B at the cleave. No folded mirror is necessary even though that could further simplify the fabrication. Although configuration of the optical field may be disturbed because of mode transformation in the truncation area, the phase-matched coupling can still be achieved, with adjustment or experimental trimming of the truncation angle.

Figure 5A:
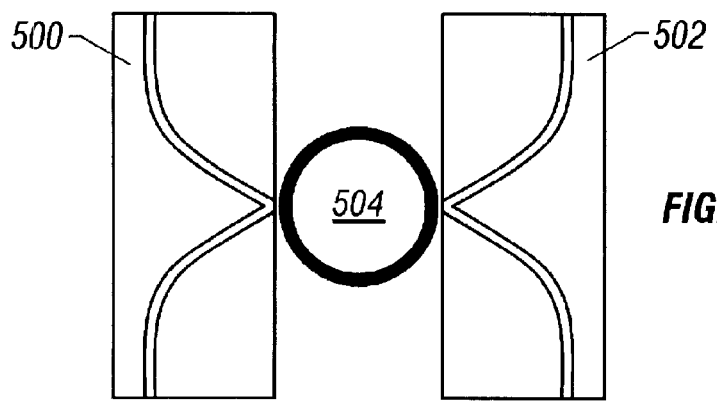
FIGS. 5A–5D show an embodiment for forming the waveguides on a chip and forming a resonator near the waveguides.
Figure 5B:
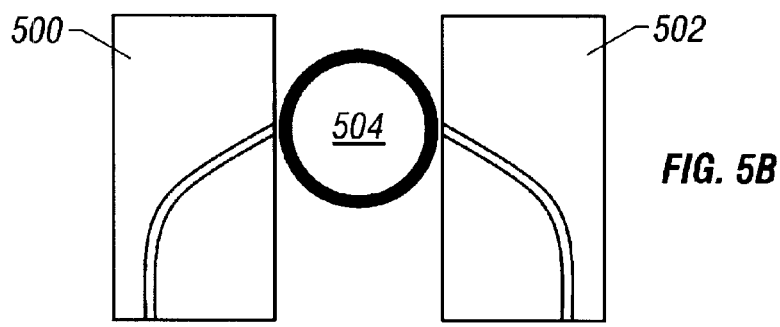

A corner reflector, or truncated guide can be formed on the edge of a substrate as shown in FIG. 4A. The throughput configuration, which is the analog of FIG. 3B, can be achieved by assembling two chips at 500, 502. The sides of a microsphere 504 can be arranged as shown in FIGS. 5A and 5B. Alternatively, the couplers can be formed in the central part of the chip 510, next to a through hole or a micromachined depression 512 that will house a microcavity 504 as shown in FIG. 5C.

Figure 5C:
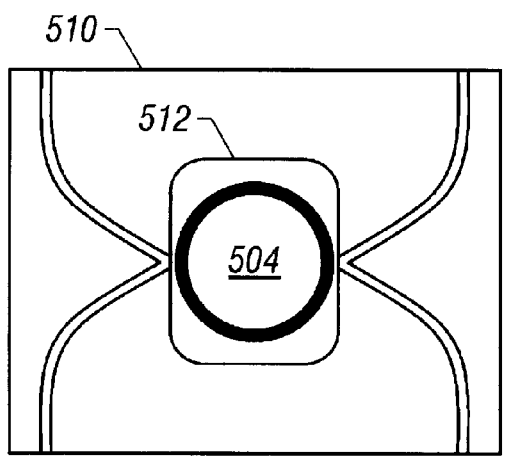
Figure 5D:
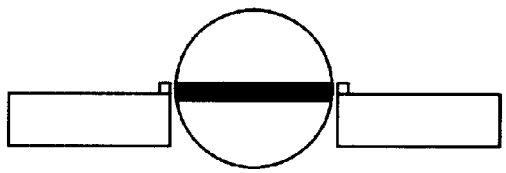

In any of FIGS. 5A–5C, the sphere 504 is arranged relative to the chip 500 as shown in FIG. 5D. Preferably the central diameter line of the sphere 500 is at or around the chip surface. This can facilitate holding the chip into place.

FIG. 5 shows the embodiments incorporating a microsphere cavity. The described method of coupling is applicable to all types of waveguide mode cavities (including disks, rings etc.). It also provides a tool to achieve efficient coupling between integrated optics components of different materials and substrates.

Figure 6A:
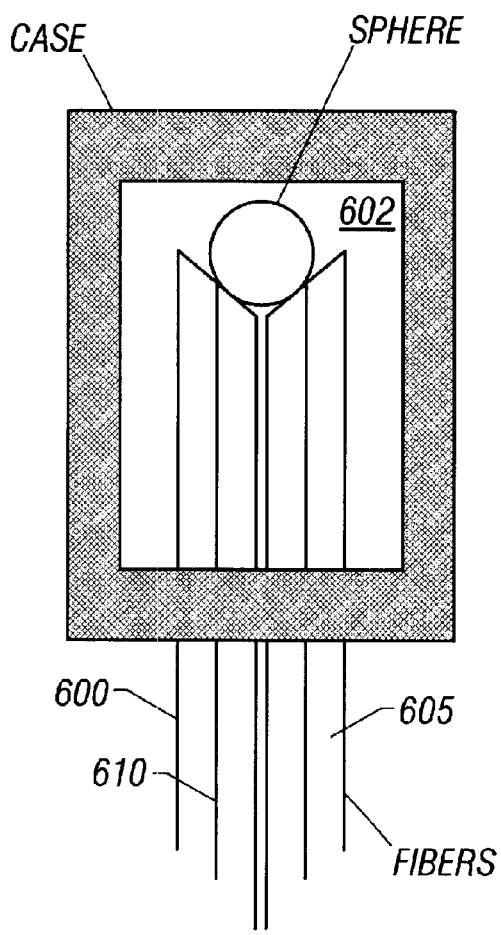
FIGS. 6A–6C show details of a system for doing this using optical waveguides.
Figure 6B:
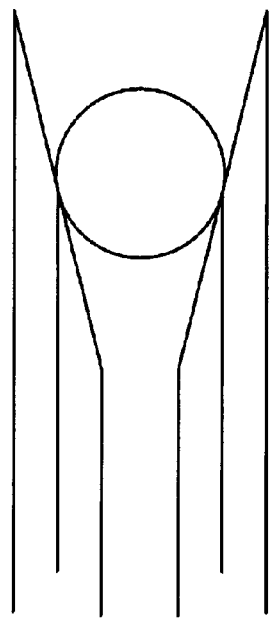
Figure 6C:
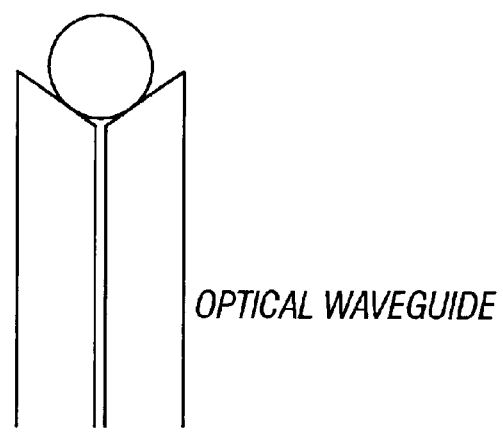

FIG. 6 shows a filter element including a waveguide microcavity within a case collinear input and output fibers/waveguides 605, 610 using a sphere for filtering non-resonant paths.

FIG. 6 shows an embodiment of device integration of a novel waveguide coupler element for waveguide modes in microspheres. A coupled optoelectronic oscillator (COEO) is based on a high-Q microsphere. COEO is a variant of a microwave optoelectronic oscillator, OEO (X.S.Yao, L.Maleki, JOSA B, Vol. 13, no. 8, pp. 1725–35, 1996), which is a microwave oscillator that uses optical energy storage elements to achieve high spectral purity signals at frequencies ranging from hundreds of MHz to above 100 GHz. These devices, normally have a laser, optical modulator, detector, microwave amplifier and fiber-optic delay, optoelectronic oscillator. Each of these devices can be implemented on a single chip except for the relatively bulky delay element. By using a miniature optical cavity such as a microsphere, the entire device can be placed on a chip.

The waveguide coupling element described herein facilitates the incorporation of a microsphere in the OEO-on-chip, thereby simplifying the setup. To operate with an optical cavity, the laser in the OEO requires locking to one of the modes of the cavity. Oscillation will occur as the microwave modulation sidebands coincide with adjacent cavity modes.

To eliminate the need for independent laser locking to cavity modes, the high-Q cavity can be incorporated into the laser resonator. An additional modulation feedback loop will ensure microwave oscillation. This is described in, "coupled OEO," (X.S.Yao, L.Maleki, Opt.Lett., Vol. 22, No. 24, pp. 1867–9, 1997).

Figure 7:
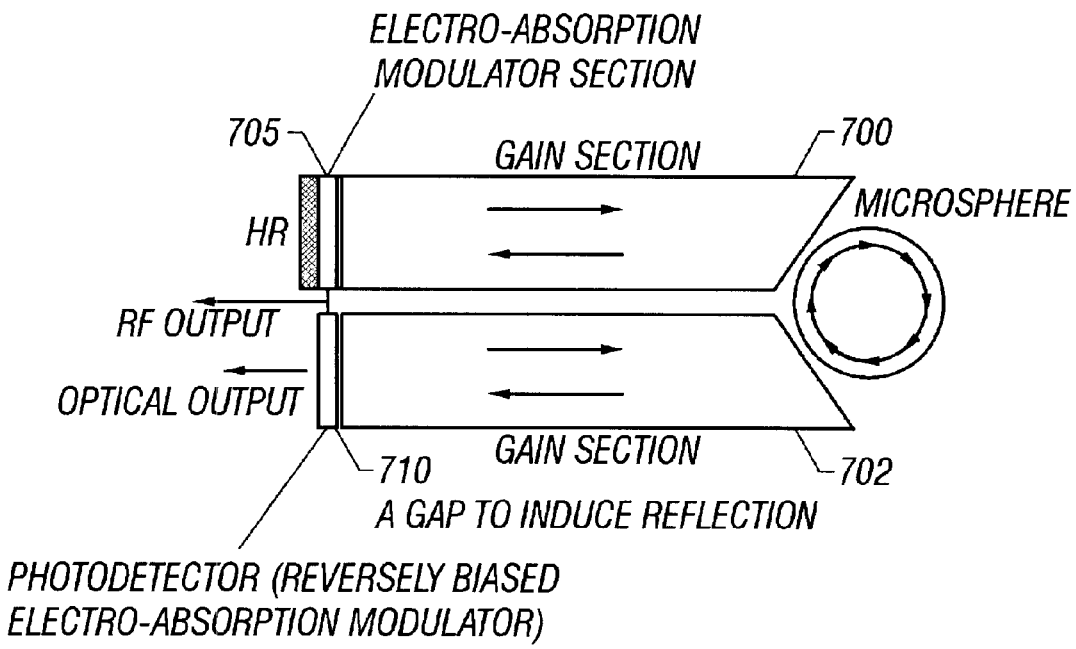
FIG. 7 shows an embodiment of carrying out electro-optical absorption on a chip.

The embodiment of COEO-on-chip, is shown in FIG. 7. When activated by a current source, the active waveguides 700, 702 provide gain for the laser system. Electro-absorption modulators 705 are fabricated at the ends of waveguides by etching out the insulating gap to separate electrodes of gain sections from modulator sections. The upper electroabsorption modulator is coated with a high-reflectivity coating to induce pulse colliding in the modulator and thus enhance the mode locking capability. At the lower section 702, the gap 710 between the electroabsorption modulator and the waveguide is etched deeper to induce optical separation. The gap interface acts as a partial mirror to reflect light back to the lower guide and form a laser cavity together with high-Q microsphere and the upper waveguide terminated by a high reflectivity mirror. The lower electroabsorption modulator is reverse biased so that it acts as a photodetector. The output from the photodetector is connected to the upper electroabsorption modulator via a relatively simple matching circuit, to induce microwave oscillation. Because the photodetector and the E/A modulator are essentially the same device, they have similar impedances to the order of few K-Ohms. Thus, these devices are essentially impedance matched. Taking typical values of a 2 Volt modulator switching voltage, a 1 kOhm of modulator and photodetector impedance, and 0.5 A/W of photodetector responsivity, the optical power required for sustained RF oscillation can be estimated at only 1.28 mW. Such an optical power is easily attainable in semiconductor lasers. This avoids the need for an RF amplifier, which can be a source of the proposed COEO design.

A second embodiment describes far field coupling, using a refractive index grating that is written onto the sphere surface. The grating can be written by shining a pattern of ultraviolet light onto a doped surface. The surface can be doped with germanium in order to increase its photosensitivity.

The microsphere is formed as follows. First, a fused silica sphere is made in a typical way, such as by fusing a preform in a small flame. A 3–5 $\mu$m thick photosensitive layer is then deposited by melting germanium oxide doped glass powder. The quality factor of the resulting sphere is about $10^8$ at $\lambda$=15–50 nanometers.

Figure 8:
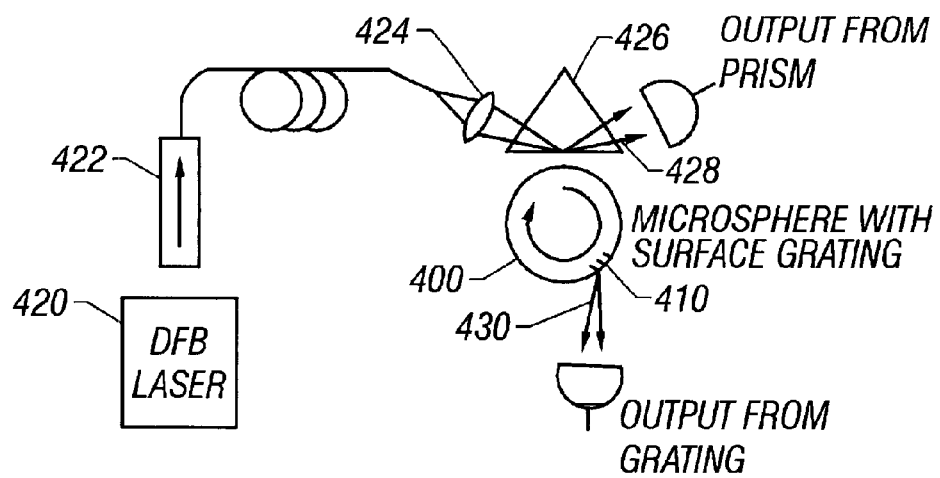
FIG. 8 shows an embodiment which couples light into a resonator using a surface grating.

The photosensitive layer is then used to form a surface grating 410 on the microsphere. 40 millowatts of a 244 nanometer UV light is used from a frequency-doubled argon laser for 5 to 10 minutes. This forms an index of modulation of about $10^{-4}$, with a grating period of 2 $\mu$m and a grating length of about 15 $\mu$m. This grating will form first order phase matching of a whispering gallery mode and a free space beam that is oriented at about 15 to 45° to the microsphere surface. The coupling of the optical information to the microsphere is shown in FIG. 8. The microsphere 400 is also formed with surface grating 410.

A laser 420 produces laser light which is confined within a waveguide 422 that can be, for example, an optical fiber.

Collimating lens 424 receives optical energy from the waveguide. The optical energy is coupled to a prism 426. The prism can produce both input and output waves, the output wave being shown as 428. Light is also coupled into the microsphere from the prism. The grating 410 produces an output 430.

A technique of fabricating the cavity for a micro-sized resonator system, capable of supporting whispering gallery modes, is also disclosed. This device can be used with any of the embodiments described previously.

Silica microspheres can support whispering gallery modes based on their precise shaping and undercutting. A problem, however, is that many of the microspheres with the highest quality have been hand-fabricated in the laboratory.

The system herein forms a whispering gallery mode in a dielectric body having axial symmetry e.g. a sphere, ellipsoid disk, ring or the like. The microspheres that are described herein can actually be any of these shapes, or can be any other shaped resonator. This system can be modeled by closed waves undergoing continuous total internal reflection. The resonances described herein correspond to completion of an integer number of wavelengths packed along the closed trajectory.

Figure 9A:
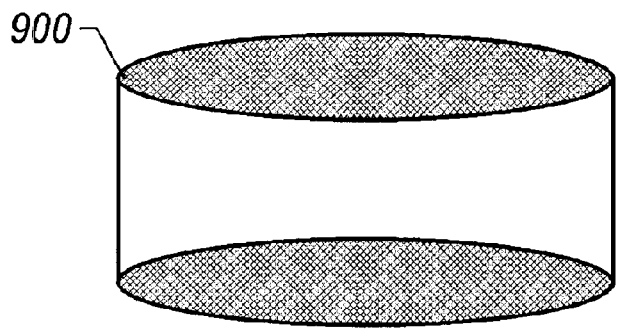
FIGS. 9A–9C shows steps of formation of a improved resonator.
Figure 9B:
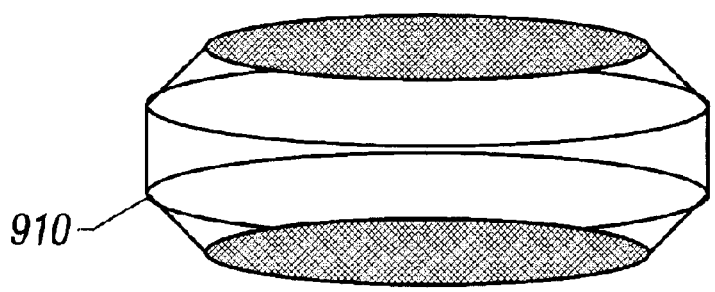
Figure 9C:
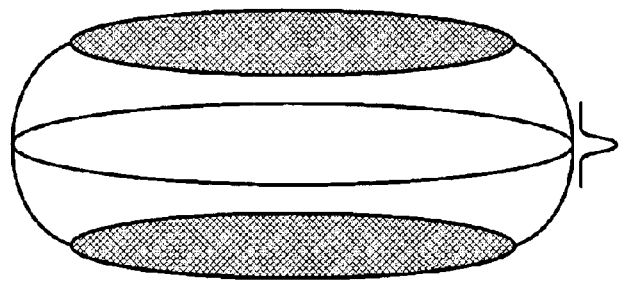

The fabrication is shown with reference to FIGS. 9A–9C. A cylindrical cavity preform of silica is formed with vertical walls as shown in FIG. 9A. In this example, the walls have a diameter 100 to 200 $\mu$m, a thickness of 20 to 40 $\mu$m, and are on a relatively flat substrate.

The vertical surface of the vertical walls is next re-shaped to provide removal of the mode field from the flat boundaries as shown in FIG. 9B. This is done by removing the edge portions 900 forming a complex shape shown in FIG. 9B. After that, further thermal and mechanical treatment is used to approach ellipsoidal geometry. The edges, e.g. 510, are rounded and smoothed to minimize surface roughness and reduce radiation loss. By rounding these surfaces, curvature confinement and fire polish grade surface can be obtained, obtaining a Q approaching $10^8$.

The cylindrical preform described in FIG. 9A can be produced by wet/dry etch as well as ion milling techniques using appropriate crystal orientation. Other techniques such as RTA laser treatment, ultraviolet treatment and infrared treatment can also be used.

Other modifications are contemplated.

What is claimed is:

1. A method of coupling between a waveguide mode and a whispering gallery mode, comprising:

forming a portion of a waveguide element, which operates in a waveguide mode, said portion having a part that induces total internal reflection which causes an evanescent field to be formed in an area of said waveguide and such that radiation in said waveguide mode forms said evanescent field at said area; and placing a resonator, which operates in a whispering gallery mode, in said area of said evanescent field.

2. A method as in claim 1 further comprising placing another waveguide adjacent said resonator, to couple said radiation between said wave guide element and said another waveguide.

3. A method as in claim 2 wherein each of said waveguides and said resonator are fabricated on a surface of a chip.

4. A method as in claim 3 further comprising holding the resonator in a way such that a specified portion of the resonator is at a specified location relative to said waveguide.

5. A method as in claim 4 wherein said resonator is a microsphere in said specified location.

6. A method as in claim 3 wherein said chip comprises a first waveguide portion on a first chip, a second waveguide portion on a second chip, and a resonator holding portion disposed between said first and second chips.

7. A method as in claim 3 wherein both said first and second waveguides are on the same chip.

8. A method as in claim 2 further comprising using said resonator in said area of said evanescent field as a filter.

9. A method as in claim 2 wherein said part that induces total internal reflection includes a corner reflector.

10. A method as in claim 2 wherein said part that induces total internal reflection which includes an angled end portion of the waveguide.

11. A method as in claim 2 wherein said part that induces total internal reflection includes a mirror.

12. A method as in claim 1 wherein said resonator is a microsphere resonator.

13. A method as in claim 12 further comprising matching a position of the microsphere resonator to an area of the evanescent field.

14. A method as in claim 1, wherein said resonator is a resonator which is resonant in said whispering gallery mode.

15. A method of coupling between a waveguide mode and a whispering gallery mode, comprising:

forming a portion of a waveguide element which is a single mode fiber, which operates in a waveguide mode, said portion which causes an evanescent field to be formed in an area of said waveguide and such that radiation in said waveguide mode forms said evanescent field at said area; and placing a resonator, which operates in a whispering gallery mode, in said area of said evanescent field.

16. A method as in claim 15 wherein said single mode fiber has an end which cleaved to a specified angle which causes total internal reflection to form said evanescent field.

17. A method as in claim 16 wherein said specified angle secures a phase matching requirement.

18. A method as in claim 17 wherein said phase matching requirement forms an angle $\Phi = \arcsin n_{sphere}/n_{fiber}$ where $n_{fiber}$ is a refractive refraction index that describes guided wave and fiber trunk core truncation area, and $n_{sphere}$ is an effective refraction index of the azimuthal propagation of the waveguide modes.

19. A method as in claim 15 further comprising another fiber near said resonator to enable coupling from said fiber to said another fiber.

20. A method of coupling information to a resonator, comprising:

forming a surface grating on the resonator; and phase matching optical energy to said surface grating to induce said optical energy to enter said resonator.

21. A method as in claim 20 further comprising forming said grating by obtaining a resonator, forming a photosensitive layer on said resonator, and using a light source to form a grating on an outside of said resonator.

22. A method as in claim 21 wherein said forming a photosensitive layer comprises melting germanium oxide doped glass powder and forming said powder on the outside of the resonator.

23. A method as in claim 22 wherein said forming a grating comprises using a ultraviolet light from a laser to form said grating.

24. A method as in claim 20 further comprising a collimating lens, coupling said optical energy towards said grating.

25. A method of coupling light from an optical fiber into a whispering gallery type resonator, comprising:

transmitting light through a core of the optical fiber;

forming a cleave on the optical fiber at a specified angle which causes total internal reflection and which forms an evanescent field outside the fiber; and locating said resonator in the location of said evanescent field to come into contact with the evanescent field.

26. A method of coupling energy, comprising:

coupling light in a waveguide mode to an ending part that causes said light to produce an evanescent field; and locating a device which has a resonant whispering gallery mode, in the location of said evanescent field to come in contact with the evanescent field and to induce energy in said whispering gallery node based on said evanescent field.

* * * * *